(12) United States Patent
Bernkopf

(10) Patent No.: US 7,535,171 B2
(45) Date of Patent: May 19, 2009

(54) SYSTEM AND METHOD FOR TOTAL LIGHT EXTRACTION FROM FLAT-PANEL LIGHT-EMITTING DEVICES

(75) Inventor: Jan Bernkopf, Valencia, PA (US)

(73) Assignee: Advantech Global, Ltd., Tortola (VG)

( * ) Notice: Subject to any disclaimer, the term of this patent is extended or adjusted under 35 U.S.C. 154(b) by 0 days.

(21) Appl. No.: 11/812,753

(22) Filed: Jun. 21, 2007

(65) Prior Publication Data

US 2008/0043475 A1 Feb. 21, 2008

Related U.S. Application Data

(60) Provisional application No. 60/815,270, filed on Jun. 21, 2006.

(51) Int. Cl.
*H01J 1/62* (2006.01)
(52) U.S. Cl. ..................... 313/506; 313/498
(58) Field of Classification Search ......... 313/503–506; 359/745
See application file for complete search history.

(56) References Cited

U.S. PATENT DOCUMENTS

| 4,894,116 | A  | 1/1990 | Barrow et al. |
| 6,770,502 | B2 | 8/2004 | Cok et al. |
| 6,917,159 | B2 | 7/2005 | Tyan et al. |
| 6,936,964 | B2 | 8/2005 | Cok |
| 7,011,420 | B2 | 3/2006 | Cok |
| 7,088,318 | B2 | 8/2006 | Malmberg |
| 7,294,961 | B2 * | 11/2007 | Daniels et al. ............... 313/504 |
| 2005/0212406 | A1 | 9/2005 | Daniels et al. |
| 2005/0266218 | A1 | 12/2005 | Peumans et al. |
| 2006/0044215 | A1 | 3/2006 | Brody et al. |
| 2006/0238897 | A1 * | 10/2006 | Nishioka .................... 359/745 |

OTHER PUBLICATIONS

V. G. Veselago, "The Electrodynamics of Substances with Simultaneously Negative Values of ε and μ," Soviet Phys. Usp., vol. 10, No. 4, (1968), pp. 509-514.
J. B. Pendry, "Negative Refraction Makes a Perfect Lens," Phys. Rev. Lett., vol. 85, No. 18, (2000), pp. 3966-3969.
V. M. Shalaev et al., "Negative Index of Refraction in Optical Metamaterials," Optics Letters, vol. 30, No. 24, (2005), pp. 3356-3358.
D. S. Burges, "Software Fills the Blanks in Imagery", Photonics Spectra, (2006), p. 21.
J. B. Pendry et al., "Reversing Light with Negative Refraction," Physics Today Online, (2004), pp. 1-15.

* cited by examiner

*Primary Examiner*—Joseph L Williams
(74) *Attorney, Agent, or Firm*—Dickstein Shapiro LLP

(57) ABSTRACT

A system and method for improving light extraction from luminescent devices such as light-emitting flat-panel displays (for example, light-emitting diode (OLED) flat-panel displays) or flat panel lamps. The system includes a material with negative index of refraction, preferably with n=−1. The presence of such material on the exit surface of the electro-optic devices such as flat panel display or lamp with light-generating medium sandwiched between materials with refractive index n>1 fully removes TIR and results in light outcoupling efficiency of about 100%.

28 Claims, 4 Drawing Sheets

SYSTEM AND METHOD FOR TOTAL LIGHT EXTRACTION FROM FLAT-PANEL LIGHT-EMITTING DEVICES

This application claims the benefit of U.S. Provisional Application No. 60/815,270, filed Jun. 21, 2006, the entire disclosure of which is incorporated by reference herein in its entirety.

FIELD OF THE INVENTION

The present invention relates to luminescent devices such as light-emitting flat-panel displays (like light-emitting diode (OLED) flat-panel displays) or flat panel lamps and, in particular, to methods of improving light extraction from such luminescent devices.

BACKGROUND OF THE INVENTION

Flat-panel light-emitting devices, where the light is generated inside luminescent media, are known in the art. Examples of such devices are, for example, electroluminescent flat panel displays such as TFEL or OLED displays. Another example is flat OLED lamp, as described in U.S. Pat. No. 6,936,964 entitled "OLED Lamp." As shown in FIG. 1, the generated light 1 exits at least through one surface 2 of device 10 into air either, through (semi)transparent electrode 3 and (semi)transparent substrate 4 and/or lid 5.

Typically, the generated light radiates from the (electro)-luminescent medium equally in all directions; these are known as Lambertian light sources (i.e., the angular light distribution follows Lambert's cosine law (FIG. 2)). However, due to the fact that the medium has refractive index greater than 1 (n>1), the amount of light that can leave the exit surface(s) is governed by the condition known as total internal reflection (TIR), i.e., only light rays with angle of incidence smaller than critical angle will be able to exit the said surface (i.e., be extracted from) the device. The ratio of amount of light extracted to amount of light generated is called outcoupling efficiency into air $\eta_{out}$ and is commonly expressed in percentages (%). The outcoupling efficiency through one surface (into one hemisphere) is given by Equation (1) below:

$$\eta_{out}=\frac{1}{2}(1-\cos\theta_c)\approx\frac{1}{4}n^2 \quad \text{Equation (1)}$$

where $\theta_c$ is the critical angle; and n is the refractive index of the medium.

In common practice, the outcoupling efficiency is described by formula set forth in Equation (2) below:

$$\eta_{out}\approx\frac{1}{2}n^2 \quad \text{Equation (2)}$$

as the light radiated in the other hemisphere is also harnessed for practical purposes (by employing reflective electrode, for example).

In a typical configuration, where the luminescent medium is a thin film of sub-wavelength thickness surrounded by glass with n≈1.5, the above formula in Equation (2) yields $\eta_{out}\approx22\%$. Thus only about 22% of light generated inside the medium is used for illumination or reaches the viewer to convey the displayed information. This inefficient light extraction has a negative impact on the overall efficiency of such electro-optical devices.

Several approaches have been suggested to improve the light outcoupling efficiency from flat panel displays or lamps. Examples of prismatic structures (or variations like lenslet arrays or cone arrays or similar structures) can be found in open literature, for example, in U.S. Pat. No. 7,011,420 entitled "Planar Directed Light Source." Another approach uses optical interference to produce microcavity effect for each of elemental color (red, green and blue), as described in U.S. Pat. No. 6,917,159 entitled "Microcavity OLED Device." Another specific application to OLED display is described in U.S. Patent Application Publ. No. 2005/0266218 entitled "Aperiodic Dielectric Multilayer Stack," wherein the authors inserted aperiodic stacks of dielectric thin films into the structure of the OLED display.

While the above-described approaches mitigate the effects of the TIR to certain degree, they rarely improve the outcoupling efficiency into air by more than factor of two. In addition, the above-mentioned solutions either degrade the quality of images on displays (prismatic structures) or are viewing angle dependent (microcavity) or wavelength dependent (aperiodic stacks of dielectric thin films). Thus, there is a need in the art for a solution that will strongly mitigate, or fully remove, the limitation of TIR on outcoupling efficiency without the undesirable effects on image quality.

BRIEF SUMMARY OF THE INVENTION

The present invention provides a structure that includes a material with negative index of refraction, preferably with n=−1, on a surface of an electro-optic device (such as flat panel display or lamp). By providing the material with negative index of refraction and a light-generating medium sandwiched between materials with refractive index n>1, the total internal reflection is eliminated, resulting in light outcoupling efficiency of about 100%.

The invention also provides a method of achieving light outcoupling efficiency of about 100% in electro-optic devices (such as flat panel displays or lamps). The method comprises the step of providing a material with negative index of refraction on a surface of the electro-optic device.

Other features and advantages of the present invention will become more apparent from the detailed description of exemplary embodiments provided below with reference to the accompanying drawings in which:

DETAILED DESCRIPTION OF THE INVENTION

Optical materials with negative index of refraction have been only as subject of theoretical studies, the most notorious being the Veselago paper published in 1967, as there are no such materials found in nature. Only metals exhibit negative index of refraction within specific wavelength range, but because of very large absorption coefficient, they do not allow for light propagation.

However, the advent of metamaterials (engineered materials) resulted in the practical demonstration of negative refraction first at microwave frequencies, followed by THz (terahertz) frequencies, and lately even in visible light range. Also the negative refraction index has been utilized for construction of a "superlens" having the shape of rectangular slab that contains a thin layer of silver (that acts as the material with negative index of refraction). Such superlens demonstrated the intriguing capability of resolution beyond the diffraction limits, as was theoretically predicted by J. B. Pendry, *Phys. Rev. Lett.* 85, 3966 (2000) and confirmed that materials with negative refractive index can be utilized for building practical devices.

Figure 3:
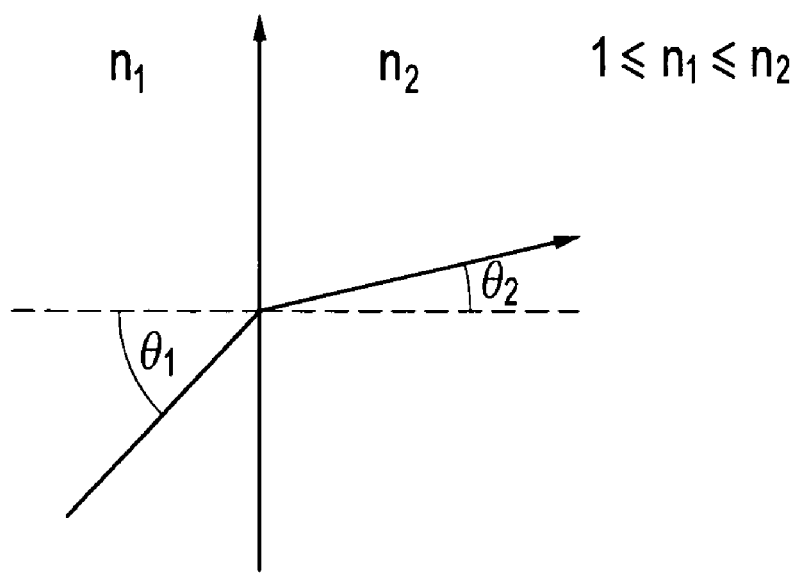
FIG. 3 shows light refraction at boundary between conventional optical materials with index of refraction n>1.
Figure 4:
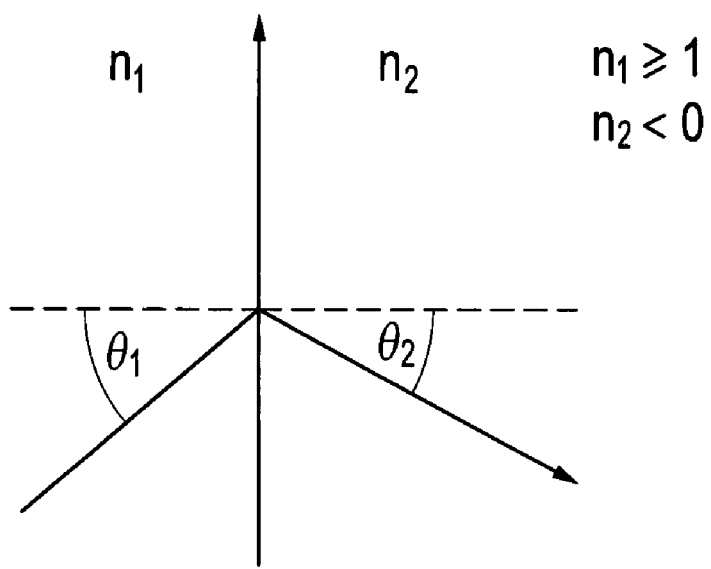
FIG. 4 shows negative light refraction, i.e., refraction at the boundary between materials with positive and negative index of refraction.

Materials with a negative refractive index exhibit unusual optical properties, one of which is used in the present invention. The phenomenon is called "negative refraction" and is exemplified on FIGS. 3 and 4. The term negative refraction means that the ray of light refracts "away" from the normal, as shown in FIG. 4. This is to be compared to the "conventional" situation shown in FIG. 3. Interestingly, the Snell's Law (Equation (3) below) is upheld in both shown cases:

$$n_1 \sin \theta_1 = n_2 \sin \theta_2 \quad \text{Equation (3)}$$

As can be seen in the case shown in FIG. 4, the condition for TIR is not satisfied for any single angle. And in case that $n_1 = -n_2$, the wave impedance match between the two media satisfies condition for total refraction, i.e., there is no reflected wave (see Y. Zhang et al., *Phys. Rev. Lett.* (2003). As the light is being outcoupled to air with n=1.0, the total refraction on the boundary to air requires material with $n_2 = -1$. Such material has been demonstrated by Zhang and coworkers in a "twinned" alloy containing yttrium, vanadium and oxygen ($YVO_4$) (see Y. Zhang et al., *Phys. Rev. Lett.* 10 (2003). Thus, applying a layer of such material to the exit surface allows full extraction of light generated in the luminescent media of display (lamp) or, in other words, about 100% outcoupling efficiency. That situation is schematically shown in FIG. 5, wherein material 50 (provided in the form of layer 50 comprising, for example, "twinned" alloy containing yttrium, vanadium and oxygen ($YVO_4$)) is provided on exit surface 44 of substrate 40.

Figure 1:
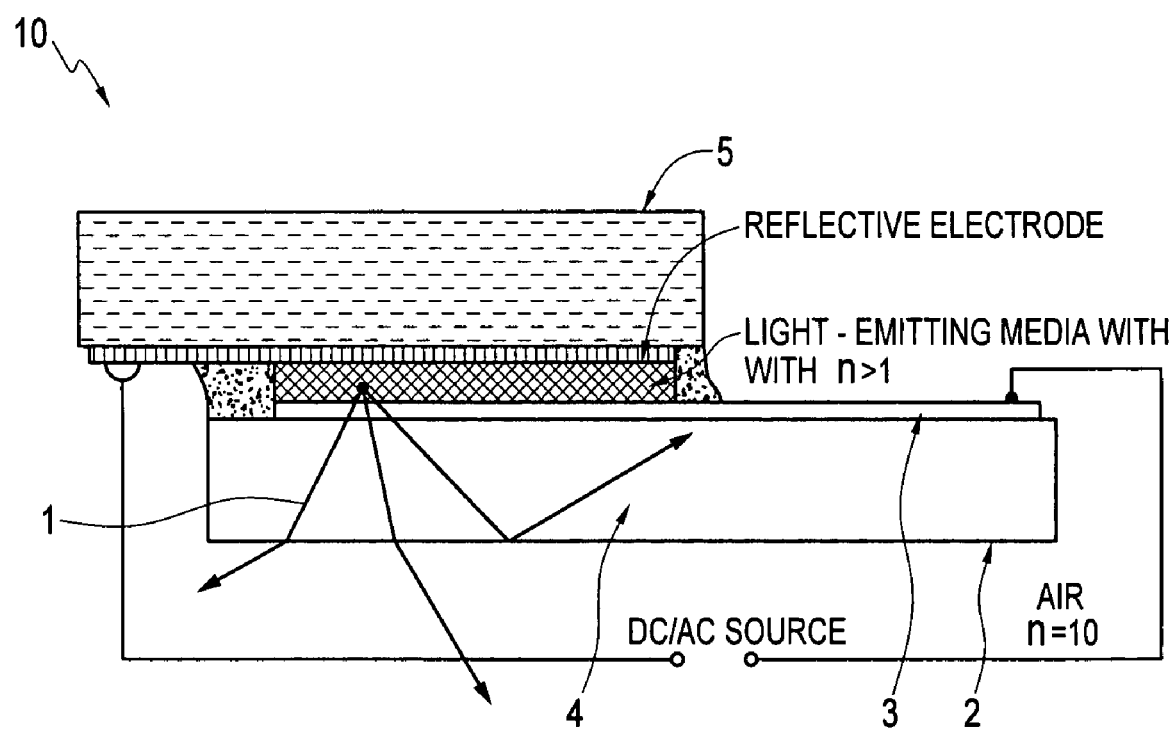
FIG. 1 illustrates the structure of a display (lamp) with at least one exit surface for the outcoupled light.
Figure 2:
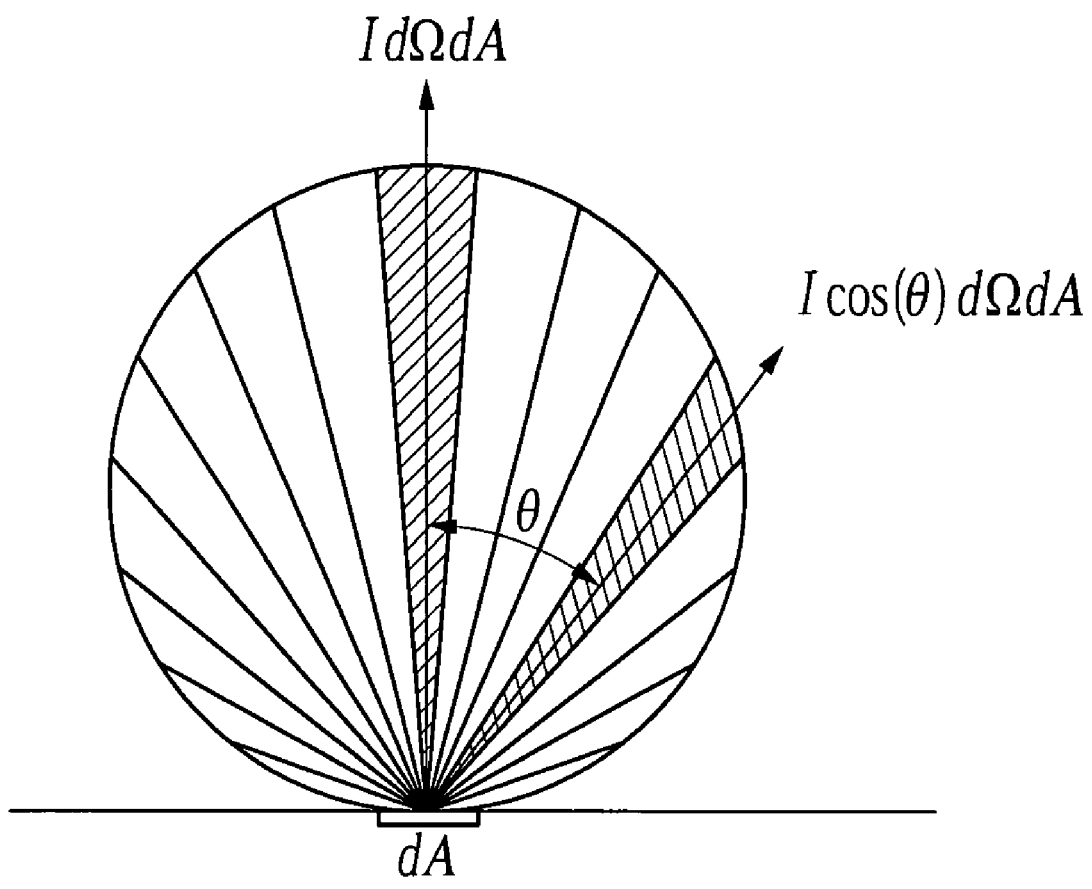
FIG. 2 illustrates a Lambertian light source that follows the cosine law for angular brightness distribution.
Figure 5:
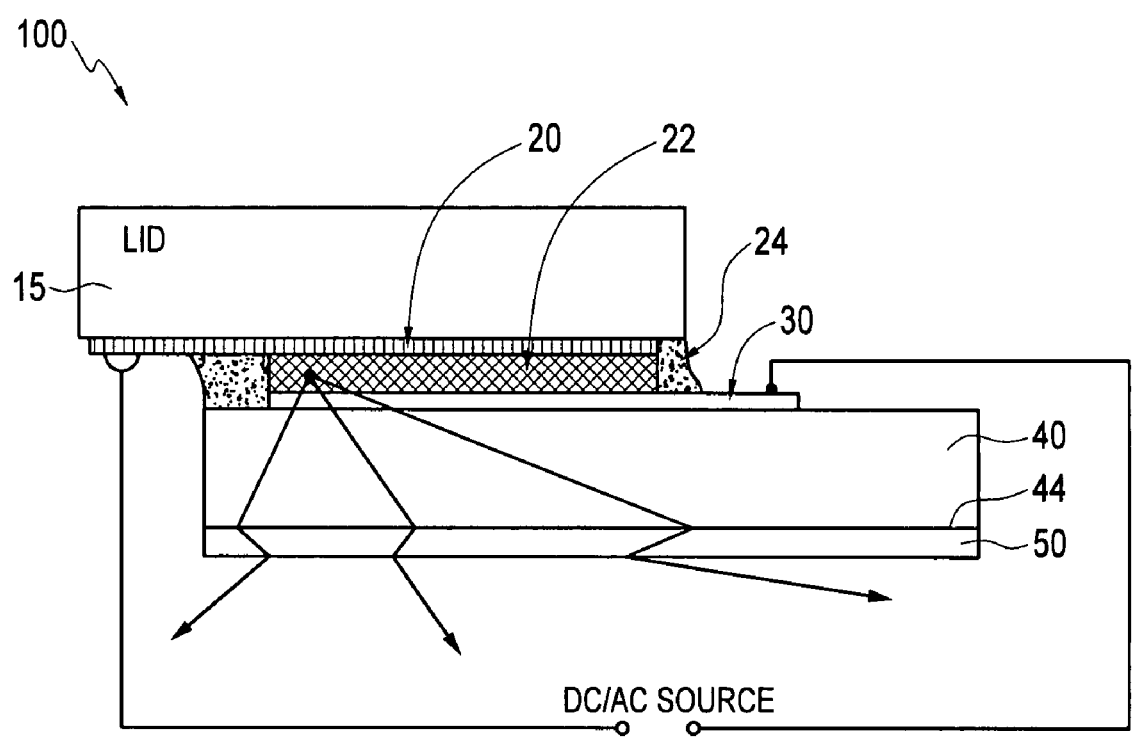
FIG. 5 shows the structure of a flat panel display with an exemplary outcoupling layer of material with negative refractive index in accordance with the present invention.

The remaining elements of electro-optic device 100 shown in FIG. 5 correspond to the elements of the conventional electro-optic device 10 shown in FIG. 1. As illustrated in FIG. 5, electro-optic device 100 also comprises reflective electrode 20, light emitting media 22 (with n>1), sealant 24, (semi)transparent electrode 30, (semi)transparent substrate 40 and/or lid 15.

A similar effect may be achieved by substituting the material 50 of FIG. 5 with a layer of specially-designed photonic materials (also known as metamaterials), and as described in more detail below with reference to specific examples of paired gold nanopillars.

Specially-designed photonic materials (metamaterials) are two-dimensional or three-dimensional structures consisting of dielectric material interlaced with metal features (nano bumps or nano rods) that yield negative refraction for visible light, as explained in V. M. Shalev et al., *Optics Letters*, 30 No. 24, 3356 (2005). Presently, the best metamaterials achieve a refractive index of about −0.7 in the visible range, but further development could yield materials with refractive index of −1 (as detailed in D. S. Burges, *Photonics Spectra*, January 2006 [Nature, Nov. 17, 2005]). Thus, total negative reflection can be achievable also with metamaterials.

EXAMPLE

According to D. S. Burges, *Photonics Spectra*, January 2006 [Nature, Nov. 17, 2005], metamaterials 50 consisting of paired gold nanopillars exhibit negative refractive index in visible range. Specifically, the array with lattice constant of about 400 nm of about 80 nm tall gold (Au) pairs of nanopillars separated by about 200 nm produced a negative refractive index of about −0.7 at 700 THz (green light). The array was deposited on a glass substrate and patterned by electron-beam lithography. Similar results have been achieved with about 90 nm tall Au nanopillar pairs with diameter of about 110 nm and separation of about 140 nm (same lattice constant). While the refractive index of −0.7 is short of the ideal value of −1.0, it still produces dramatic improvement in outcoupling through the glass-air boundary.

Although the invention has been described in detail in connection with the exemplary embodiments, it should be understood that the invention is not limited to the above disclosed embodiments. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A device, comprising:
    a substrate having a first surface and an opposite second surface;
    a light-emitting material disposed over the first surface of the substrate for emitting light which passes through the substrate; and
    a material with a refractive index of less than zero disposed over the second surface of the substrate through the emitted light exits, such that the emitted light exits the substrate with about 100% outcoupling efficiency.

2. The device of claim 1, wherein the material with a refractive index of less than zero has a refractive index of about −1.

3. The device of claim 1, wherein the material with a refractive index of less than zero has a refractive index of about −0.7.

4. The device of claim 1, wherein the material with a refractive index of less than zero comprises a metal alloy.

5. A device, comprising:
    a substrate having a first surface and an opposite second surface;
    a light-emitting material disposed over the first surface of the substrate; and
    a material with a refractive index of less than zero disposed over the second surface of the substrate wherein the material with a refractive index of less than zero comprises yttrium, vanadium and oxygen.

6. The device of claim 1, wherein the material with a refractive index of less than zero is a multi-dimensional structure comprising a dielectric material intertwined with metal nano-structures.

7. The device of claim 6, wherein the metal nano-structures are selected from the group consisting of nano-rods, nano-pillars and nano-bumps.

8. The device of claim 1, wherein the material with a refractive index of less than zero is a three-dimensional structure comprising a dielectric and metal nano-pillars of about 80 to about 90 nm tall.

9. The device of claim 8, wherein the material with a refractive index of less than zero is a three-dimensional structure comprising glass dielectric with gold nano-pillars of about 80 to about 90 nm tall.

10. The device of claim 1, wherein the light-emitting material is provided between materials with a refractive index greater than about 1.

11. The device of claim 1, wherein total internal reflection of the light emitted by the light-emitting material is about 100%.

12. An electronic display assembly, comprising:
a substrate;
a display region coupled to a first surface of the substrate, the display region comprising at least one active display element for emitting light which passes through the substrate; and
a material with a refractive index of about −1 disposed over a second surface of the substrate through the emitted light exits, such that the emitted light exits the substrate with about 100% outcoupling efficiency.

13. An electronic display assembly, comprising:
a substrate;
a display region coupled to a first surface of the substrate, the display region comprising at least one active display element; and
a material with a refractive index of about −1 disposed over a second surface of the Substrate, wherein the material with a refractive index of about −1 comprises yttrium, vanadium and oxygen.

14. The electronic display assembly of claim 12, wherein the material with a refractive index of about −1 is a multi-dimensional structure comprising a dielectric material intertwined with metal nano-structures.

15. The electronic display assembly of claim 12, wherein the active display element is a light-emitting device.

16. The electronic display assembly of claim 12, wherein the light-emitting device is an organic light-emitting diode.

17. The electronic display assembly of claim 12, wherein the light-emitting device is a flat-panel lamp.

18. A method for reducing internal reflection of light in an electronic display structure, comprising the steps of:
generating and emitting light from a light emitting media;
passing the light through a substrate having a first surface disposed adjacent to the light emitting media and a second surface opposite to the first surface, the light exiting the substrate through the second surface;
providing a material with a refractive index of less than about zero adjacent the second surface of the substrate, such that the emitted light exits the substrate with about 100% outcoupling efficiency.

19. The method of claim 18, wherein the material with a refractive index of less than about zero comprises a metal.

20. The method of claim 18, wherein the material with a refractive index of less than about zero is an alloy comprising yttrium, vanadium and oxygen.

21. The method of claim 18, wherein the step of providing the material with a refractive index of less than about zero further comprises forming a multi-dimensional structure of a dielectric material intertwined with metal nano-structures.

22. The method of claim 21, wherein the metal nano-structures are selected from the group consisting of nano-rods, nano-pillars and nano-bumps.

23. The method of claim 21, wherein the metal nano-structures comprise at least a three-dimensional structure comprising a dielectric and gold nano-pillars, the gold nano-pillars having a height of about 80 to about 90 nm.

24. The method of claim 23, wherein the gold nano-pillars are formed by electro-beam lithography on a glass dielectric.

25. A method of increasing light extraction from a luminescent device, the method comprising the steps of:
providing a display region coupled to a first surface of a substrate, the display region comprising at least one active display element for emitting light;
passing the light emitted from the display element through the substrate to a second surface, opposite to said first surface, through which the emitted light exits the device; and
providing a multi-dimensional structure comprising a metamaterial having a negative index of refraction adjacent the second surface of the substrate, such that the emitted light exits the substrate with about 100% outcoupling efficiency.

26. A method of increasing light extraction from a luminescent device, the method comprising the steps of:
providing a display region coupled to a surface of a substrate, the display region comprising at least one active display element; and
forming a multi-dimensional structure comprising a metamaterial adjacent another surface of the substrate, wherein the metamaterial comprises gold.

27. A method of increasing light extraction from a luminescent device, the method comprising the steps of:
providing a display region coupled to a surface of a substrate, the display region comprising at least one active display element; and
forming a multi-dimensional structure comprising a metamaterial adjacent another surface of the substrate, wherein the metamaterial has a refractive index of about −0.7 in the visible range.

28. A method of increasing light extraction from a luminescent device, the method comprising the steps of:
providing a display region coupled to a surface of a substrate, the display region comprising at least one active display element; and
forming a multi-dimensional structure comprising a metamaterial adjacent another surface of the substrate, wherein the metamaterial has a refractive index of about −1.

* * * * *